United States Patent

Nagase et al.

Patent Number: 5,451,484
Date of Patent: Sep. 19, 1995

[54] POSITIVE RESIST COMPOSITION

[75] Inventors: Kyoko Nagase, Ibaraki; Haruyoshi Osaki, Toyonaka; Hiroshi Moriuma, Nara, all of Japan

[73] Assignee: Sumitomo Chemical Company, Ltd., Osaka, Japan

[21] Appl. No.: 67,933

[22] Filed: May 27, 1993

[30] Foreign Application Priority Data

May 27, 1992 [JP] Japan ................... 4-134863

[51] Int. Cl.$^6$ ............................................. G03F 7/023
[52] U.S. Cl. .................... 430/192; 430/165; 430/191; 430/193; 528/153; 528/155
[58] Field of Search ............... 430/191, 192, 193, 165; 528/153, 155

[56] References Cited

U.S. PATENT DOCUMENTS

| | | | |
|---|---|---|---|
| 4,731,319 | 3/1988 | Kohara et al. | 430/165 |
| 5,112,719 | 5/1992 | Yamada et al. | 430/192 |
| 5,166,033 | 11/1992 | Oie et al. | 430/192 |
| 5,215,856 | 6/1993 | Jayaraman | 430/192 |
| 5,238,774 | 8/1993 | Hosaka et al. | 430/192 |

FOREIGN PATENT DOCUMENTS

| | | |
|---|---|---|
| 0336604 | 10/1989 | European Pat. Off. |
| 358871 | 3/1990 | European Pat. Off. |
| 0416544 | 3/1991 | European Pat. Off. |
| 416544 | 3/1991 | European Pat. Off. |
| 63-261257 | 10/1988 | Japan |
| 3179353 | 5/1991 | Japan |

*Primary Examiner*—Charles L. Bowers, Jr.
*Assistant Examiner*—John S. Chu
*Attorney, Agent, or Firm*—Birch, Stewart, Kolasch & Birch

[57] ABSTRACT

A positive resist composition comprising a quinonediazide compound and an alkali-soluble resin containing resin (A) obtainable through a condensation reaction of at least one compound represented by the general formula (I):

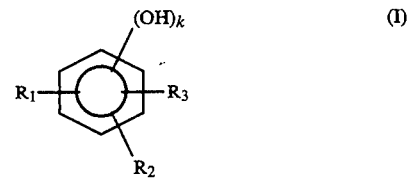

wherein $R_1$, $R_2$ and $R_3$ independently of one another each represent a hydrogen atom or an alkyl or alkoxy group having 1-4 carbon atoms and k represents 1 or 2, at least one polyphenol compound represented by the general formula (II):

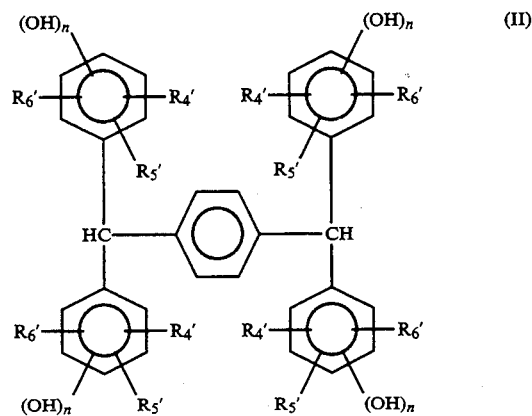

wherein $R_4'$ to $R_6'$ each represent a hydrogen atom or an alkyl or alkoxy group and n represents 1 or 2, with an aldehyde compound. This positive resist composition is excellent in properties such as profile, resolution, heat resistance, etc.

16 Claims, No Drawings

POSITIVE RESIST COMPOSITION

BACKGROUND OF THE INVENTION

1. Field of the Invention

The present invention relates to a positive resist composition. More particularly, the present invention relates to a positive resist composition which is sensitive to radiations such as ultraviolet rays (g ray, i ray), far ultraviolet rays including excimer laser and the like, electron beam, ion beam, X ray and the like.

2. Description of the Related Art

A composition comprising a quinonediazide compound and an alkali-soluble resin finds use as a positive photoresist because, upon exposure to light having a wavelength of 500 nm or shorter, the quinonediazide group decomposes to form a carboxyl group whereby the originally alkali-insoluble composition becomes alkali-soluble. Since the positive photoresist has much better resolution than a negative photoresist composition, it is used in the production of integrated circuits such as IC or LSI.

Recently, with the rise in the integration level of integrated circuits, the width of wiring in integrated circuits has become finer. To this end, etching is carried out mainly by dry etching in place of conventional wet etching. In the dry etching process, the shape of resist is directly reflected upon the shape of etched layer. If the shape of resist is not good, the etching can extend into the areas not to be etched and can make the formed integrated circuit defective or lower the product yield. For this reason, a resist good in profile is demanded today more earnestly than ever. Further, in the dry etching process, an elevation of substrate temperature can take place to cause a thermal deformation of resist pattern and a reduction of dimensional accuracy. For this reason, a high heat resistance of resist is demanded more earnestly than ever. When the currently used positive photoresists are checked from these viewpoints, they do not necessarily have the satisfactory profile, resolution, heat resistance, etc.

SUMMARY OF THE INVENTION

An object of the present invention is to provide a positive resist composition which is excellent in various properties such as profile, resolution and heat resistance.

According to the present invention, there is provided a positive resist composition comprising a quinonediazide compound and an alkali-soluble resin containing a resin (A) obtainable through a condensation reaction of at least one phenol compound represented by the following general formula (I):

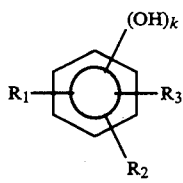

wherein $R_1$, $R_2$ and $R_3$ independently of one another each represent a hydrogen atom or an alkyl or alkoxy group having 1–4 carbon atoms and k represents 1 or 2, at least one polyphenol compound represented by the following general formula (II):

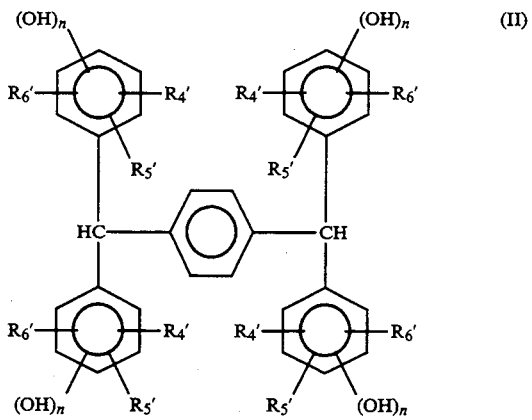

wherein $R_4'$, $R_5'$ and $R_6'$ independently of one another each represent a hydrogen atom or an alkyl or alkoxy group having 1–4 carbon atoms and n represents 1 or 2, with an aldehyde compound.

DESCRIPTION OF THE INVENTION

The phenol compounds represented by the general formula (I) include phenol, o-cresol, m-cresol, p-cresol, 3,5-xylenol, 2,5-xylenol, 2,3-xylenol, 3,4-xylenol, 2,3,5-trimethylphenol, 4-tert-butylphenol, 2-tert-butylphenol, 3-tert-butylphenol, 2-tert-butyl-4-methylphenol, 2-tert-butyl-5-methylphenol, 6-tert-butyl-3-methylphenol, 2-methylresorcinol, 4-methylresorcinol, 5-methylresorcinol, 4-tert-butylcatechol, 4-methoxyphenol, 3-methoxyphenol, 2-methoxyphenol, 2-methoxycatechol, 2-methoxyresorcinol, 3-methoxyresorcinol, 2,3-dimethoxyphenol, 2,5-dimethoxyphenol, 3,5-dimethoxyphenol, 3-ethylphenol, 2-ethylphenol, 4-ethylphenol, 2,3,5-triethylphenol, 3,5-diethylphenol, 2,5-diethylphenol and the like. Among them, m-cresol, p-cresol, 3,5-xylenol, 2,5-xylenol, 2,3,5-trimethylphenol, 2-tert-butyl-5-methylphenol and 6-tert-butyl-3-methylphenol are preferred.

The phenol compounds are used independently or as a mixture of two or more of them. Examples of the mixtures are those of m-cresol and p-cresol; m-cresol and 3,5-xylenol; m-cresol and 2,3,5-trimethylphenol; m-cresol and 6-tert-butyl-3-methylphenol; m-cresol, p-cresol and 3,5-xylenol; m-cresol, p-cresol and 2,3,5-trimethylphenol; m-cresol, p-cresol and 6-tert-butyl-3-methylphenol; and the like.

When two or more phenol compounds are used in the form of a mixture, the mixing ratio may be selected appropriately.

As the alkyl or alkoxy group represented by $R_4'$ to $R_6'$ in the general formula (II), straight chain and branched chain alkyl and alkoxy groups can be referred to. Among them, methyl, ethyl, tert-butyl, methoxy and ethoxy groups are preferred.

As the polyphenol compound represented by the general formula (II), compounds represented by the following formula:

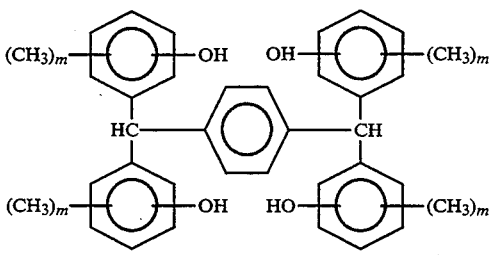

wherein m is 0, 1, 2 or 3, and the like can be referred to. Among them, a compound of the following formula:

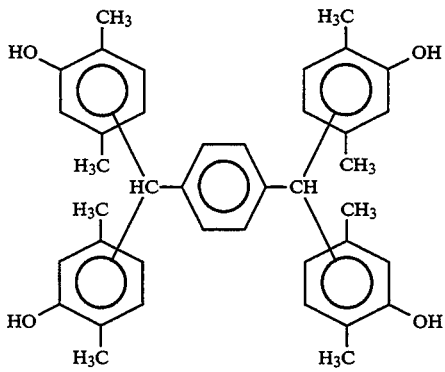

is particularly preferred.

The polyphenol compounds represented by the general formula (II) can be produced by carrying out a dehydrating condensation reaction of the corresponding phenol compound with terephthalaldehyde in the presence of an acid catalyst, as mentioned in, for example, Japanese Patent Application KOKAI No. 3-179353.

Preferably, the molar ratio of the phenol compound represented by the general formula (I) to the polyphenol compound represented by the general formula (II) is from 60:40 to 99.5:0.5.

Examples of the aldehyde compound to be subjected to a condensation reaction with the phenol compound represented by the general formula (I) and the polyphenol compound represented by the general formula (II) include formaldehyde, acetaldehyde, propionaldehyde, n-butyraldehyde, isobutyraldehyde, trimethylacetaldehyde, n-hexyl aldehyde, acrolein, crotonaldehyde, cyclohexane aldehyde, cyclopentane aldehyde, furfural, furylacrolein, benzaldehyde, o-tolualdehyde, p-tolualdehyde, m-tolualdehyde, p-ethylbenzaldehyde, 2,4-dimethylbenzaldehyde, 2,5-dimethylbenzaldehyde, 3,4-dimethylbenzaldehyde, 3,5-dimethylbenzaldehyde, phenylacetaldehyde, o-hydroxybenzaldehyde, p-hydroxybenzaldehyde, m-hydroxybenzaldehyde, succinaldehyde, o-anisaldehyde, p-anisaldehyde, m-anisaldehyde, vanillin and the like.

These aldehyde compounds may be used independently or as a mixture thereof. As the aldehyde compound, formaldehyde is preferable because it is readily available industrially.

Preferably, the aldehyde compound is used in an amount of 0.35-2 moles per mole of the sum of the phenol compound (I) and the polyphenol compound (II).

The acid catalysts which can be used in the condensation reaction include inorganic acids such as hydrochloric acid, sulfuric acid, perchloric acid, phosphoric acid and the like, organic acids such as formic acid, acetic acid, oxalic acid, trichloroacetic acid, p-toluenesulfonic acid and the like, and divalent metal salts such as zinc acetate, zinc chloride, magnesium acetate and the like. These acid catalysts may be used independently or as a mixture thereof. Preferably, the acid catalyst is used in an amount of 0.005-2 moles per mole of the sum of the phenol compound (I) and the polyphenol compound (II).

The conditions of the condensation reaction are as follows. The temperature is usually 60°-250° C., preferably 8°-120° C. and the time is usually 2-30 hours, preferably 10-20 hours. A phenol compound (I), a polyphenol compound (II) and an aldehyde compound are charged either in one portion or in several portions and allowed to react. The condensation reaction is carried out either in a bulk phase or in a solvent. Examples of the solvent include water; alcohols such as methanol, ethanol, iso-propanol, n-butanol, iso-amyl alcohol and the like; ketones such as methyl isobutyl ketone, methyl ethyl ketone, cyclohexanone and the like; hydrocarbons such as hexane, heptane, cyclohexane, benzene, toluene, xylene and the like; and methyl cellosolve, ethyl cellosolve, ethyl cellosolve acetate and the like. Usually, the amount of solvent is 10-1,000 parts by weight per 100 parts by weight of the sum of the phenol compound (I) and the polyphenol compound (II).

As the resin (A), one having an area in a GPC pattern of a range in that the molecular weight, as converted to polystyrene, which is not larger than 1,000 does not exceed 30% of the whole pattern area, excluding the unreacted phenol compounds, using UV-254 nm detector (hereinafter the same), is preferred. From the viewpoint of improvement in heat resistance and scum, those in which the above-mentioned condition is satisfied and an area in a GPC pattern of a range in that the molecular weight, as converted to polystyrene, which is not larger than 6,000 is from 15% to 65% of the whole pattern area, excluding the unreacted phenol compounds. Such a resin can easily be obtained by carrying out a procedure of fractionation or the like after the condensation reaction. The fractionation is carried out by dissolving a resin produced by the condensation reaction in a good solvent such as alcohols (methanol, ethanol and the like), ketones (acetone, methyl ethyl ketone, methyl isobutyl ketone and the like), ethylene glycol or its ethers, ether esters (ethyl cellosolve acetate and the like), tetrahydrofuran and the like, and pouring a resulting solution in water to precipitate the resin, or by pouring the solution in a solvent such as pentane, hexane, heptane, cyclohexane or the like to separate it.

As the resin (A), one having a polystyrene-converted average molecular weight of 2,000-20,000 in the GPC pattern is preferred.

A preferred alkali-soluble resin contains both the resin (A) and a low molecular weight novolak resin (B) having a polystyrene-converted average molecular weight of 200-2,000 in the GPC pattern.

In a more preferred embodiment, the alkali-soluble resin satisfies the above-mentioned conditions and also the resin (A) has an area in a GPC pattern of a range in that the molecular weight, as converted to polystyrene, which is not larger than 1,000 does not exceed 30% of the whole pattern area, excluding the unreacted phenol compound. Further, the alkali-soluble resin is particularly preferred, when said resin satisfies the above-mentioned conditions and also the resin (A) has an area in a GPC pattern of a range in that the molecular weight, as converted to polystyrene, which is not larger than 6000 is from 15% to 65% of the whole pattern area, excluding the unreacted phenol.

The low molecular weight novolak resin (B) can be produced by reacting a phenol compound with an aldehyde such as formaldehyde, paraformaldehyde, acetaldehyde, glyoxal or the like in the presence of an acid catalyst. Examples of said phenol compound include phenol, o-cresol, m-cresol, p-cresol, 3,5-xylenol, 2,5-xylenol, 2,3-xylenol, 2,4-xylenol, 2,6-xylenol, 3,4-xylenol, 2,3,5-trimethylphenol, resorcinol and the like. These phenol compounds may be used independently or as a mixture thereof by taking the solubility in the alkaline developing solution into consideration. Among the phenol compounds mentioned above, o-cresol, m-cresol and p-cresol are preferable.

As the acid catalyst, the same inorganic acids, organic acids and divalent metal salts as mentioned above can be referred to. The reaction temperature is 30°–250° C., and the other reaction conditions are the same as those of the above-mentioned condensation reaction.

More preferably, the low molecular weight novolak resin (B) has a polystyrene-converted average molecular weight (measured by GPC) of 200 to 1,000. When the average molecular weight exceeds 2,000, the sensitivity of the positive resist composition decreases. When the average molecular weight is lower than 200, adhesion of the resist to a substrate and heat resistance are deteriorated. The average molecular weight of the low molecular weight novolak resin (B) can be easily controlled by adjusting the molar ratio of the aldehyde to the phenol compound. For example, a low molecular weight novolak resin (B) having an average molecular weight of 200 to 2,000 can be prepared by reacting m-cresol with formaldehyde in a molar ratio (formaldehyde/m-cresol) of 0.65:1 to 0.05:1. After the reaction, unreacted monomers are preferably removed, for example, by distillation. A preferred amount of the low molecular weight novolak resin (B) is 4 to 50 parts by weight per 100 parts by weight of the whole amount of the alkali-soluble resin. When the amount of the low molecular weight novolak resin (B) is lower than 4 parts by weight, the solubility of the resist composition in the alkaline developing solution decreases. When this amount exceeds 50 parts by weight, a part which is not irradiated is easily dissolved in the alkaline developing solution so that the patterning becomes difficult.

The preferred positive resist composition of the present invention contains, in addition to the alkali-soluble resin including the resin (A) and quinone diazide compound, an additive compound of the formula (III):

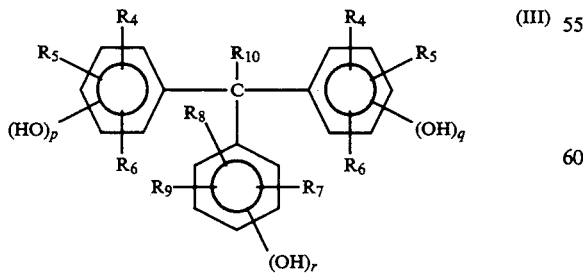

wherein $R_4$, $R_5$, $R_6$, $R_7$, $R_8$ and $R_9$ independently of one another each represent a hydrogen atom or an alkyl or alkoxy group having 1–4 carbon atoms; $R_{10}$ represents a hydrogen atom, an alkyl group having 1–4 carbon atoms or an aryl group; and p, q and r independently of one another each represent 0, 1 or 2.

In the general formula (III), the alkyl or alkoxy group for the $R_4$ to $R_9$ may be a straight or branched one and preferably a methyl, an ethyl, a methoxy or an ethoxy group. The aryl group for $R_{10}$ may be a substituted or unsubstituted aryl group. Preferred substituents are an alkyl group, a hydroxyl group and the like. Examples of the aryl group are a phenyl group, a naphthyl group, a benzyl group, a phenethyl group and the like. Preferred examples of the compound (III) are

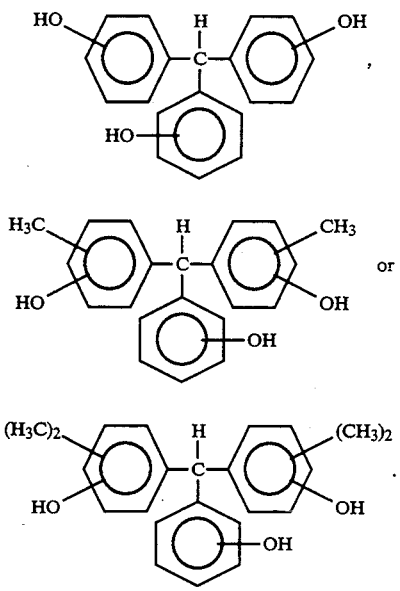

In particular, the following compounds are preferred as the compound (III):

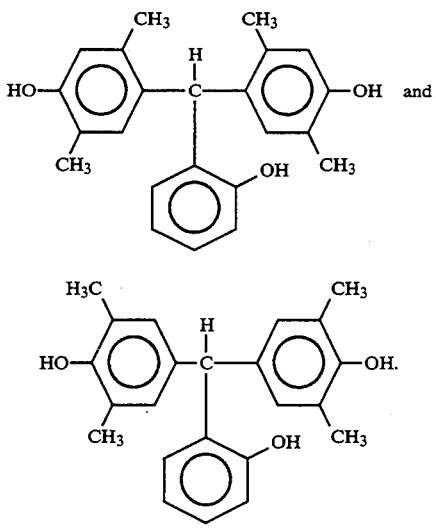

The compound of the formula (III) may be produced by, for example, a method disclosed in Japanese Patent Application KOKAI No. 2-275955. The content of the compound (III) is form 4 to 40 parts by weight, preferably 20–30 parts by weight per 100 parts by weight of the total weight of the alkali-soluble resin.

Insofar as the effect of the present invention is not deteriorated, the alkali-soluble resin may contain other alkali-soluble resins or compounds in addition to the resin (A) and the low molecular weight novolak resin (B). Examples of said alkali-soluble resin include novolak resins other than the resin (A) and the low molecular weight novolak resin (B), polyvinylphenol and the like.

Examples of said novolak resin other than the resin (A) and the low molecular weight novolak resin (B) include the resins prepared by reacting at least one phenol compound selected from the group consisting of phenol, o-cresol, m-cresol, p-cresol, 2,5-xylenol, 3,4-xylenol, 2,3,5-trimethylphenol, 4-tert-butylphenol, 2-tert-butylphenol, 3-tert-butylphenol, 2-tert-butyl-5-methylphenol, 3-ethylphenol, 2-ethylphenol, 4-ethylphenol, 2-naphthol, 1,3-dihydroxynaphthalene, 1,5-dihydroxynaphthalene and 1,7-dihydroxynaphthalene with formaldehyde by a conventional manner.

The quinonediazide compound is not particularly critical. Examples of the quinonediazide compound include 1,2-benzoquinonediazide-4-sulfonic acid esters, 1,2-naphthoquinonediazide-4-sulfonic acid esters, 1,2-naphthoquinonediazide-5-sulfonic acid esters, and the like. These quinonediazide compounds can be produced, for example, through a condensation reaction of benzoquinone-diazidesulfonic acid or 1,2-naphthoquinonediazidesulfonic acid with a compound having a hydroxyl group in the presence of a weak alkali.

Examples of said compound having a hydroxyl group include hydroquinone; resorcin; phloroglucin; 2,4-dihydroxybenzophenone; trihydroxybenzophenones such as 2,3,4-trihydroxybenzophenone, 2,2',3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2,3',4-trihydroxybenzophenone, 2,3',5-trihydroxybenzophenone, 2,4,4'-trihydroxybenzophenone, 2,4',5-trihydroxybenzophenone, 2',3,4-trihydroxybenzophenone, 3,3',4-trihydroxybenzophenone, 3,4,4'-trihydroxybenzophenone and the like; tetrahydroxybenzophenones such as 2,3,3',4-tetrahydroxybenzophenone, 2,3,4,4'-tetrahydroxybenzophenone, 2,2',4,4'-tetrahydroxybenzophenone, 2,2',3,4-tetrahydroxybenzophenone, 2,2',3,4'-tetrahydroxybenzophenone, 2,2',5,5'-tetrahydroxybenzophenone, 2,3',4',5-tetrahydroxybenzophenone, 2,3',5,5'-tetrahydroxybenzophenone and the like; pentahydroxybenzophenones such as 2,2',3,4,4'-pentahydroxybenzophenone, 2,2',3,4,5'-pentahydroxybenzophenone, 2,2',3,3',4-pentahydroxybenzophenone, 2,3,3',4,5'-pentahydroxybenzophenone and the like; hexahydroxybenzophenones such as 2,3,3',4,4',5'-hexahydroxybenzophenone, 2,2',3,3',4,5'-hexahydroxybenzophenone and the like; alkyl esters of gallic acid; the oxyflavans mentioned in Japanese Patent Application KOKAI No. 2-84650 (corresponding to U.S. Pat. No. 5,059,507) as general formula (I); the compounds mentioned in Japanese Patent Application KOKAI No. 2-269351 (corresponding to European Patent Publication No. 341 608A) as general formula (I); the compounds mentioned in Japanese Patent Application KOKAI No. 3-49437 as general formula (I); and the compounds represented by the following general formula (IV):

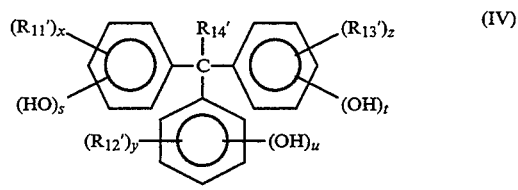

wherein $R_{11}'$, $R_{12}'$, $R_{13}'$ and $R_{14}'$ independently of one another each represent a hydrogen atom or an alkyl, alkenyl, alkoxy or aryl group; s, t and u each represent 0, 1, 2, 3 or 4, provided that s+t+u is 2 or more; and x, y and z each represent 0, 1, 2, 3 or 4.

Particularly preferable quinonediazide compounds are the condensation products of a compound represented by the general formula (IV) with 1,2-naphthoquinonediazidesulfonic acid, said condensation products having two or more ester groups on the average.

The quinonediazide compound is used either singly or in the form of a mixture of two or more members, in an amount of usually 5-50% by weight, preferably 10-40% by weight based on the total weight of the alkali-soluble resin, provided that when a compound represented by the general formula (III) is added as an additive, based on the sum of the compound represented by formula (III) and the alkali-soluble resin.

A solvent in which the components are dissolved is preferably one that evaporates at a suitable drying rate to give a uniform and smooth coating film. Examples of such solvents include glycol ether esters such as ethyl cellosolve acetate, propylene glycol monomethyl ether acetate and the like; the solvents mentioned in Japanese Patent Application KOKAI No. 2-220056; esters such as ethyl pyruvate, n-amyl acetate, ethyl lactate, and the like; ketones such as 2-heptanone, γ-butyrolactone and the like. These solvents are used either singly or in the form of a mixture of two or more members. An amount of the solvent is not critical insofar as the composition can form a uniform film on a wafer without pinholes or coating irregularity. Usually, however, the amount of the solvent is adjusted so that the solid component including quinonediazide compound, alkali-soluble resin and the like in the positive resist composition is from 3 to 50% by weight.

If desired, a sensitizer, other resin, a surfactant, a stabilizer, a dye and the like may be added to the positive resist solution.

The present invention will be explained more concretely by following examples which do not intend to limit the scope of the present invention.

Referential Example 1

To a mixture of 67.91 g of a compound represented by the following formula (b):

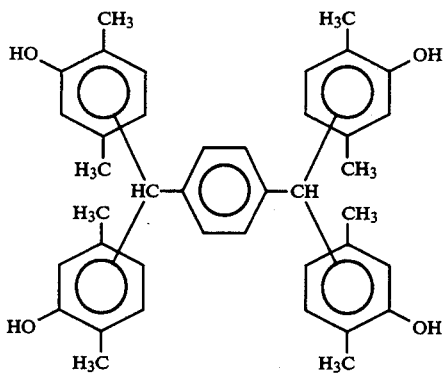 (b)

and 128.7 g of m-cresol, 128.7 g of p-cresol, 250 g of methyl isobutyl ketone, 37.0 g of 11% aqueous solution of oxalic acid and 85 g of 90% acetic acid was dropwise added 132.7 g of 37% aqueous solution of formaldehyde at 95° C. over a period of one hour with stirring. After the addition, the resulting mixture was allowed to react at the same temperature as above for 15 hours. The reaction mixture was washed with water and dehydrated by azeotropic distillation to obtain a solution of a novolak resin in methyl isobutyl ketone. The novolak resin had a polystyrene-converted weight average molecular weight of 4,310, as measured by GPC.

A mixture of 120 g of the solution of novolak resin in methyl isobutyl ketone obtained above (content of novolak resin: 38.37%), 182.9 g of methyl isobutyl ketone and 218.8 g of n-heptane was stirred at 60° C. for 30 minutes, and then allowed to stand and separated into two liquid layers. Then, 94 g of 2-heptanone was added to the under layer, and the resulting mixture was concentrated with an evaporator to obtain a solution of a novolak resin in 2-heptanone.

As measured by GPC, the novolak resin had a polystyrene-converted weight average molecular weight of 9,397. An area in a GPC pattern of a range in that the molecular weight, as converted to polystyrene, which is not larger than 6,000 was 42% of a whole pattern area excluding the unreacted phenol, and an area in that the molecular weight which is not larger than 1,000 was 11%.

Referential Example 2

Reaction, washing with water and dehydration were carried out in the same manner as in Referential Example 1, except that the compound of formula (b) was not used and the amounts of m-cresol and p-cresol were both altered to 135 g, to obtain a solution of a novolak resin in methyl isobutyl ketone. As measured by GPC, the product had a polystyrene-converted weight average molecular weight of 4,550.

A mixture of 100 g of the solution of novolak resin in methyl isobutyl ketone obtained above (content of novolak resin: 40%), 188.7 g of methyl isobutyl ketone and 199.4 g of n-heptane was stirred at 60° C. for 30 minutes, and then allowed to stand and separated into two liquid layers. Then, 120 g of 2-heptanone was added to the under layer, and the resulting mixture was concentrated with an evaporator to obtain a solution of a novolak resin in 2-heptanone.

As measured by GPC, the novolak resin had a polystyrene-converted weight average molecular weight of 9,540. An area in a GPC pattern of a range in that the molecular weight, as converted to polyethylene, which is not larger than 6000 was 37.5% of a whole pattern area, excluding the unreacted phenol compounds, and an area in that the molecular weight which is not larger than 1,000 was 18.1%.

Example 1 and Comparative Example 1

Each of the novolak resins obtained in Referential Examples 1 and 2, a compound represented by the following formula (a):

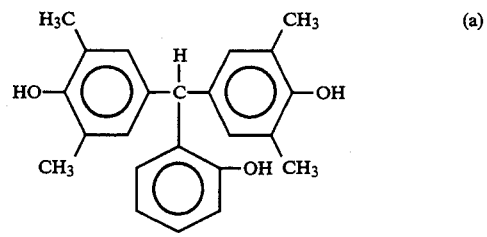 (a)

and a quinonediazide compound were dissolved in 2heptanone and γ-butyrolactone according to the formulation shown in Table 1. The amounts of the solvents were controlled so as to give a film thickness of 1.055 μm under the coating condition mentioned below. The resulting solutions were filtered with 0.2 μm Teflon filter to prepare resist solutions. A silicon wafer having been washed in the usual manner was coated with each resist solution by means of a spinner at 4,000 r.p.m. Then, the silicon wafer was baked on a vacuum suction type hot plate at 90° C. for one minute. Then, the wafer was exposed to light while varying the exposure time stepwise by means of a reduction projection exposing means of a reduced projection type light-exposing apparatus having a ultra high pressure mercury lamp as a light source (Nikon NSR1755i 7A). Thereafter, the silicon wafer was developed with developing solution SOPD (manufactured by Sumitomo Chemical Co., Ltd.) to obtain a positive pattern.

Then, a cross section of 0.4 μm line-and-space (L/S) was observed by means of SEM (scanning electron microscope), and sensitivity was evaluated from an exposure time at which the line-and-space ratio 1:1 was achieved at the best focus. A film thickness retention was determined from a remaining film thickness in the unexposed part. Heat resistance was evaluated by heating the silicon wafer having the developed resist pattern in a clean oven set at various temperature in an air for 30 minutes and again observing the resist pattern by the SEM, whereby a temperature at which the resist pattern started to deform was recorded. The results are shown in Table 1. Table 1 demonstrates that the positive resist composition of the present invention is excellent in properties such as heat resistance, profile, resolution, etc.

| Example No. | Novolak resin (Referential Example No.) | Compound (a) | Quinonediazide compound | Sensitivity *2 (msec) | Film thickness retention (%) | Resolution (μm) | Heat resistance *3 (°C.) | Profile |
|---|---|---|---|---|---|---|---|---|
| Example 1 | (1) 10.43 parts | 3.9 parts | (c) *1 2.7 parts | 152 | 100 | 0.35 | 175 |  |
| Comparative Example 1 | (2) 10.43 parts | 3.9 parts | (c) *1 2.7 parts | 158 | 100 | 0.40 | 160 |  |

*1 Quinonediazide compound (c): A condensation reaction product of a compound of the following formula:

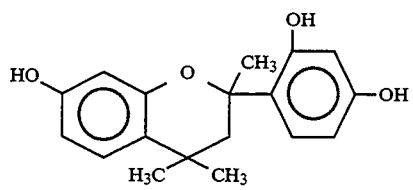

with naphthoquinone-(1,2)-diazide-(2)-5-sulfonyl chloride in which 2.8 hydroxyl groups on the average are esterified.

*2 The value at which a 0.4 μm L/S begins breakage at a ratio of 1:1.

*3 The inner temperature of clean oven at which resist pattern started to deform.

What is claimed is:

1. A positive resist composition comprising in admixture a quinonediazide compound and an alkali-soluble resin containing resin (A) obtainable through a condensation reaction of at least one phenol compound represented by the following general formula (I):

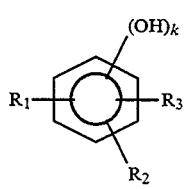

wherein $R_1$, $R_2$ and $R_3$ independently of one another each represent a hydrogen atom or an alkyl or alkoxy group having 1 to 4 carbon atoms and k represents 1 or 2, at least one polyphenol compound represented by the following general formula (II):

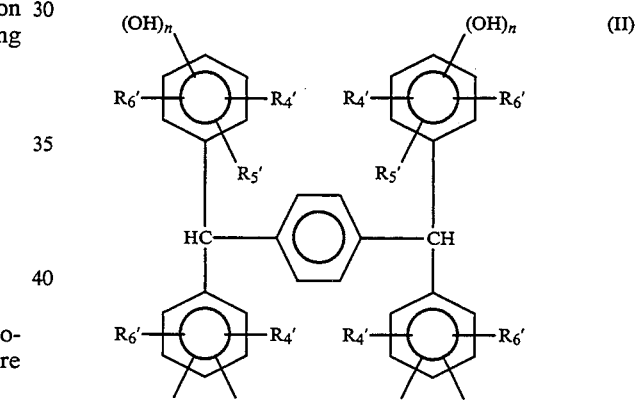

wherein $R_4'$, $R_5'$ and $R_6'$ independently of one another each represent a hydrogen atom or an alkyl or alkoxy group having 1 to 4 carbon atoms and n represents 1 or 2, with a monoaldehyde compound.

2. A positive resist composition according to claim 1, wherein said polyphenol compound of the formula (II) is a compound of the following formula:

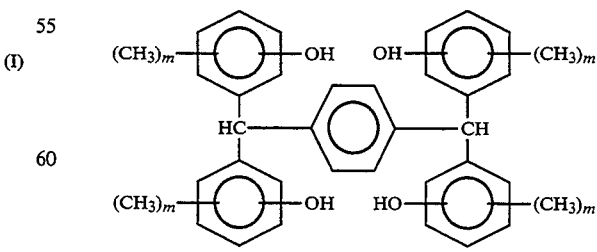

wherein m represents 0, 1, 2 or 3.

3. A positive resist composition according to claim 2, wherein said polyphenol compound of the formula (II) is a compound of the following formula:

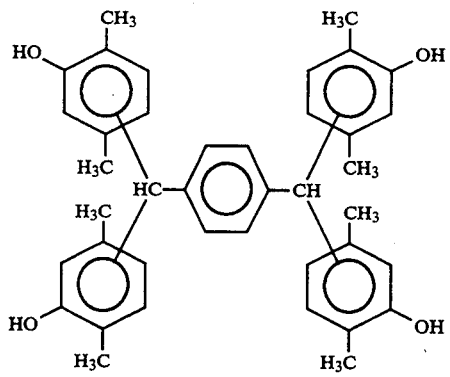

4. A positive resist composition according to claim 1, wherein said phenol compound of the formula (I) is a compound selected from the group consisting of m-cresol, p-cresol, 3,5-xylenol, 2,5-xylenol, 2,3,5-trimethylphenol, 6-tert-butyl-3-methylphenol and 2-tert-butyl-5-methylphenol.

5. A positive resist composition according to claim 1, wherein the molar ratio of said phenol compound of the formula (I) to said polyphenol compound of the formula (II) in the condensation reaction is a range from 60:40 to 99.5:0.5.

6. A positive resist composition according to claim 1, wherein said resin (A) has an area in a GPC pattern of a range in that the molecular weight, as converted to polystyrene, which is not larger than 1000 does not exceed 30% of the whole pattern area, excluding the unreacted phenol compounds.

7. A positive resist composition according to claim 6, wherein said resin (A) has an area in a GPC pattern of a range in that the molecular weight, as converted to polystyrene, which is not larger than 6,000 is from 15% to 65% of the whole pattern area, excluding the unreacted phenol compounds.

8. A positive resist composition according to claim 1, wherein the polystyrene-converted average molecular weight of resin (A) is from 2,000 to 20,000 in the GPC pattern.

9. A positive resist composition according to claim 1, wherein the alkali-soluble resin further contains a low molecular weight novolak resin (B) of which polystyrene-converted average molecular weight is from 200 to 2,000 in the GPC pattern.

10. A positive resist composition according to claim 9, wherein said low molecular weight novolak resin (B) is a cresol novolak resin.

11. A positive resist composition according to claim 9, wherein said low molecular weight novolak resin (B) has a polystyrene-converted average molecular weight of 200 to 1,000 in the GPC pattern.

12. A positive resist composition according to claim 9, wherein the content of said low molecular weight novolak resin (B) is from 4 to 50 parts by weight per 100 parts by weight of the total quantity of the alkali-soluble resin.

13. A positive resist composition according to claim 1, which further contains a compound represented by the following general formula (III):

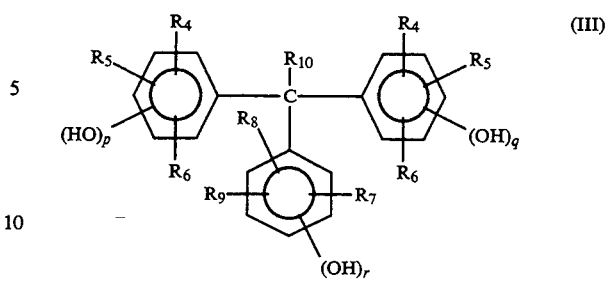

wherein $R_4$, $R_5$, $R_6$, $R_7$, $R_8$ and $R_9$ independently of one another each represent a hydrogen atom or an alkyl or alkoxy group having 1 to 4 carbon atoms, $R_{10}$ represents a hydrogen atom, an alkyl group having 1 to 4 carbon atoms or an aryl group, and p, q and r independently of one another each represent 0, 1 or 2.

14. A positive resist composition according to claim 13, wherein said compound of the formula (III) is a compound selected from the group consisting of 15. A positive resist composition according to claim 13, wherein said compound of the formula (III) is a compound selected from the group consisting of 16. A positive resist composition according to claim 13, wherein the content of said compound of the formula (III) is from 4 to 40 parts by weight per 100 parts by weight of the total quantity of the alkali-soluble resin.

* * * * *